(12) United States Patent
Harada

(10) Patent No.: US 9,564,240 B2
(45) Date of Patent: Feb. 7, 2017

(54) SEMICONDUCTOR STORAGE DEVICE

(71) Applicant: Kabushiki Kaisha Toshiba, Minato-ku (JP)

(72) Inventor: Yoshikazu Harada, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/986,887

(22) Filed: Jan. 4, 2016

(65) Prior Publication Data
US 2016/0268001 A1  Sep. 15, 2016

Related U.S. Application Data

(63) Continuation of application No. PCT/JP2013/068657, filed on Jul. 8, 2013.

(51) Int. Cl.
*G11C 16/04* (2006.01)
*G11C 16/34* (2006.01)
(Continued)

(52) U.S. Cl.
CPC ....... *G11C 16/3459* (2013.01); *G11C 16/0483* (2013.01); *G11C 16/10* (2013.01);
(Continued)

(58) Field of Classification Search
CPC .................................................. G11C 16/04
(Continued)

(56) References Cited

U.S. PATENT DOCUMENTS 5,969,985 A * 10/1999 Tanaka ................. G11C 7/1006
365/185.03
6,044,013 A * 3/2000 Tanaka ................. G11C 7/1006
365/185.03
(Continued)

FOREIGN PATENT DOCUMENTS

JP   2006-172523 A   6/2006
JP   2008-535138 A   8/2008
(Continued)

OTHER PUBLICATIONS

Taiwanese Office Action issued May 4, 2015 in Patent Application No. 102129877 (with English Translation).
(Continued)

*Primary Examiner* — Harry W Byrne
(74) *Attorney, Agent, or Firm* — Oblon, McClelland, Maier & Neustadt, L.L.P.

(57) ABSTRACT

A semiconductor storage device according to an embodiment includes a memory cell array including a plurality of memory cells. A plurality of word lines are connected to the memory cells. A plurality of bit lines are connected to one end of current paths of the memory cells. A sense amplifier part is connected to the bit lines. A data write operation includes a first write loop and a second write loop. The first write loop includes a first program operation and a first verify operation. The second write loop includes a second program operation and a second verify operation. The sense amplifier part discharges a voltage of at least one of the bit lines in the first verify operation. The sense amplifier part keeps voltages of the bit lines in the second verify operation.

12 Claims, 9 Drawing Sheets

(51) Int. Cl.
*G11C 16/24* (2006.01)
*G11C 16/26* (2006.01)
*G11C 16/10* (2006.01)
*G11C 16/28* (2006.01)

(52) U.S. Cl.
CPC .............. *G11C 16/24* (2013.01); *G11C 16/26* (2013.01); *G11C 16/28* (2013.01)

(58) Field of Classification Search
USPC .................. 365/185.01, 185.02, 185.03, 185.05,365/185.06, 185.1, 185.11, 185.17, 185.21,365/185.22
See application file for complete search history.

(56) References Cited

U.S. PATENT DOCUMENTS

| | | | | |
|---|---|---|---|---|
| 6,282,117 | B1* | 8/2001 | Tanaka | G11C 7/1006 365/185.03 |
| 6,363,010 | B2* | 3/2002 | Tanaka | G11C 7/1006 365/185.03 |
| 6,907,497 | B2* | 6/2005 | Hosono | G11C 16/3454 365/185.22 |
| 7,120,051 | B2 | 10/2006 | Gorobets et al. | |
| 7,196,933 | B2 | 3/2007 | Shibata | |
| 7,697,336 | B2 | 4/2010 | Jeon et al. | |
| 8,009,470 | B2 | 8/2011 | Iwai et al. | |
| 8,451,663 | B2 | 5/2013 | Lee | |
| 2001/0040821 | A1* | 11/2001 | Tanaka | G11C 7/1006 365/185.03 |
| 2002/0097603 | A1* | 7/2002 | Tanaka | G11C 7/1006 365/185.03 |
| 2003/0214853 | A1* | 11/2003 | Hosono | G11C 16/3454 365/200 |
| 2009/0323429 | A1 | 12/2009 | Lee et al. | |
| 2010/0329013 | A1 | 12/2010 | Shikata et al. | |
| 2011/0292736 | A1 | 12/2011 | Honda | |
| 2011/0305089 | A1 | 12/2011 | Abe et al. | |
| 2014/0082266 | A1* | 3/2014 | Fujiu | G11C 11/5628 711/103 |

FOREIGN PATENT DOCUMENTS

| | | |
|---|---|---|
| JP | 2010-134984 A | 6/2010 |
| JP | 2011-8857 A | 1/2011 |
| JP | 2011-526049 A | 9/2011 |
| JP | 4786171 B2 | 10/2011 |
| JP | 2011-253579 A | 12/2011 |
| JP | 2011-258289 A | 12/2011 |
| JP | 5043827 B2 | 10/2012 |

OTHER PUBLICATIONS

Taiwanese Office Action issued Aug. 31, 2015 in Patent Application No. 102129877 (with English Translation).
International Preliminary Report on Patentability and Written Opinion issued Jan. 21, 2016 (English Translation only).
Office Action issued Sep. 9, 2016 in Japanese Patent Application No. 2015-526030 (with English translation).

* cited by examiner

SEMICONDUCTOR STORAGE DEVICE

CROSS REFERENCE TO RELATED APPLICATIONS

This application is based upon and claims the benefit of priority from the prior PCT International Patent Application No. PCT/JP2013/068657, filed on Jul. 8, 2013, the entire contents of which are incorporated herein by reference.

FIELD

The embodiments of the present invention relate to a semiconductor storage device.

BACKGROUND

Semiconductor storage devices such as a NAND flash memory are commonly known.

DETAILED DESCRIPTION

Figure 1:
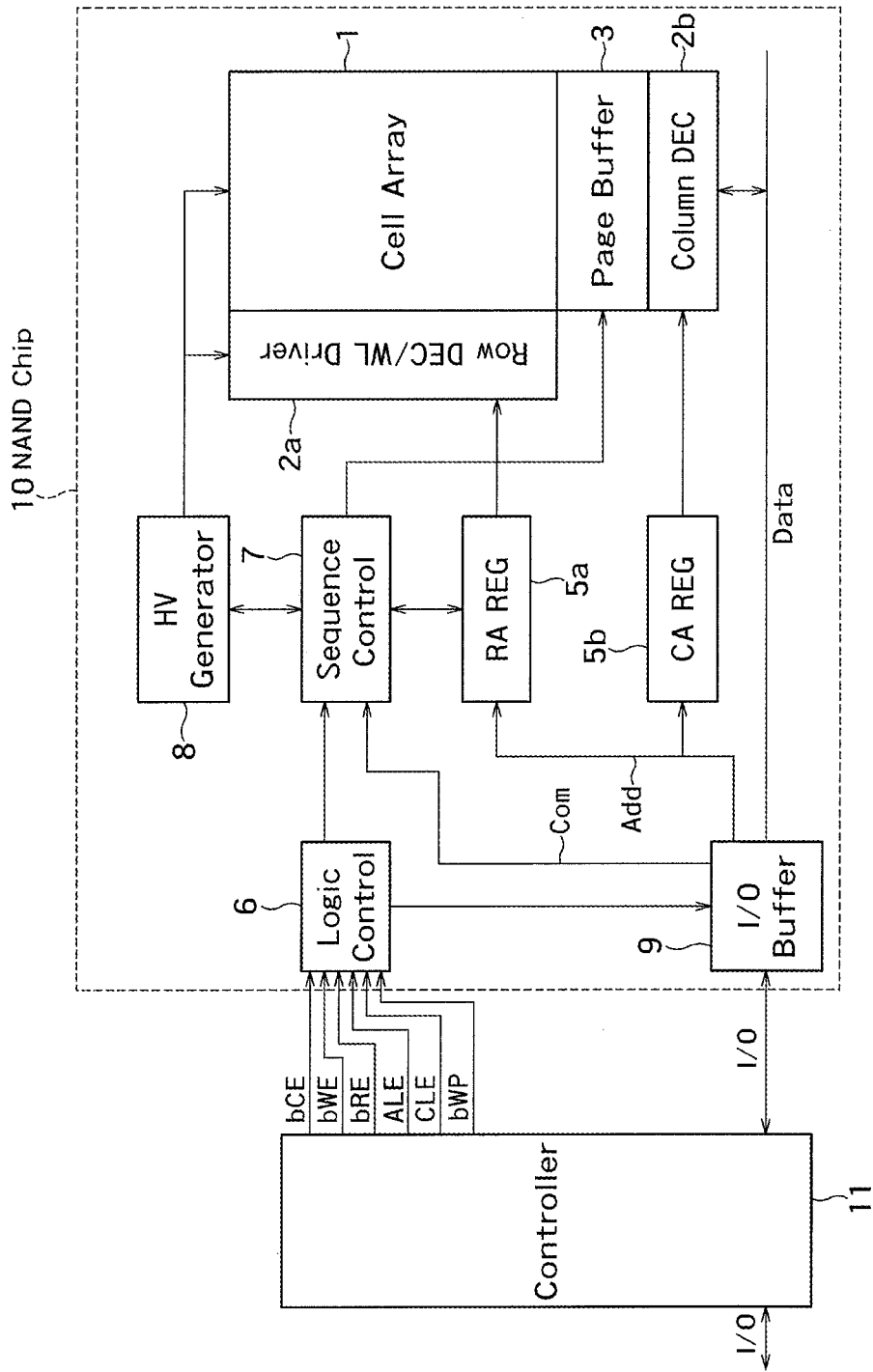
FIG. 1 is a block diagram showing an example of a configuration of a NAND flash memory according to a first embodiment.

A semiconductor storage device according to an embodiment includes a memory cell array including a plurality of memory cells. A plurality of word lines are connected to the memory cells. A plurality of bit lines are connected to one end of current paths of the memory cells. A sense amplifier part is connected to the bit lines. A data write operation includes a first write loop and a second write loop. The first write loop includes a first program operation and a first verify operation. The second write loop includes a second program operation and a second verify operation. The sense amplifier part discharges a voltage of at least one of the bit lines in the first verify operation. The sense amplifier part keeps voltages of the bit lines in the second verify operation.

Embodiments will now be explained with reference to the accompanying drawings. The present invention is not limited to the embodiments. In the explanations of embodiments, common parts are denoted by common reference characters in all drawings. However, it should be noted that the drawings are schematic and that relations between the thickness and the planar dimension, ratios of the thicknesses of layers, and the like differ from actual ones.

Therefore, specific thicknesses and dimensions are to be determined in consideration of the following explanations. It is needless to mention that parts differing in the relations or ratios of the dimensions among the drawings are included.

First Embodiment

FIG. 1 is a block diagram showing an example of a configuration of a NAND flash memory according to a first embodiment. The NAND flash memory according to the first embodiment includes a NAND chip 10 and a controller 11 that controls the NAND chip 10. The NAND chip 10 and the controller 11 can be sealed with a resin in one package as a multi-chip package (MCP).

A memory cell array 1 constituting the NAND chip 10 is configured to have a plurality of memory cells MC arrayed two-dimensionally in a matrix. These memory cells MC include a charge accumulation layer. The memory cells MC are not limited to FG (Floating Gate) memory cells and may be MONOS (Metal-Oxide-Nitride-Oxide-Silicon) memory cells, for example. A row decoder/word line driver 2a, a column decoder 2b, a page buffer 3, and an internal-voltage generation circuit 8 constitute a data write/read circuit that performs write and read of data in units of pages to/from the memory cell array 1. The row decoder/word line driver 2a selectively drives word lines in the memory cell array 1. The page buffer 3 includes a sense amplifier circuit and a data retention circuit corresponding to one page and performs read and write of data in units of pages of the memory cell array 1.

Read data corresponding to one page in the page buffer 3 is selected column by column by the column decoder 2b and is output to an external I/O terminal via an I/O buffer 9. Write data supplied from the I/O terminal is selected by the column decoder 2b to be loaded into the page buffer 3. Write data corresponding to one page is loaded into the page buffer 3. A row address signal and a column address signal are input via the I/O buffer 9 and are transferred to the row decoder 2a and the column decoder 2b, respectively. A row address register 5a retains an erase block address in an erase operation and retains a page address in a write or read operation. A first column address to be used to load write data before start of a write operation or a first column address for a read operation is input to a column address register 5b. The column address register 5b retains the input column address until a write enable signal bWE or a read enable signal bRE is toggled on a predetermined condition.

A logic control circuit 6 controls input of a command or an address and input/output of data based on a control signal such as a chip enable signal bCE, a command enable signal CLE, an address-latch enable signal ALE, the write enable signal bWE, or the read enable signal bRE. The read operation or the write operation is performed according to a command. Upon reception of a command, a sequence control circuit 7 executes sequence control of read, write, or erase. The internal-voltage generation circuit 8 receives an external power supply voltage VCC and generates predetermined voltages required for various operations under control of the sequence control circuit 7. An internal power supply voltage VDC for a sense amplifier, explained later, is generated by the internal-voltage generation circuit 8.

The controller 11 executes control on write and read of data on a condition suitable for a present write state of the NAND chip 10. It is needless to mention that a part of the read control can be executed by the NAND chip 10.

Figure 2:
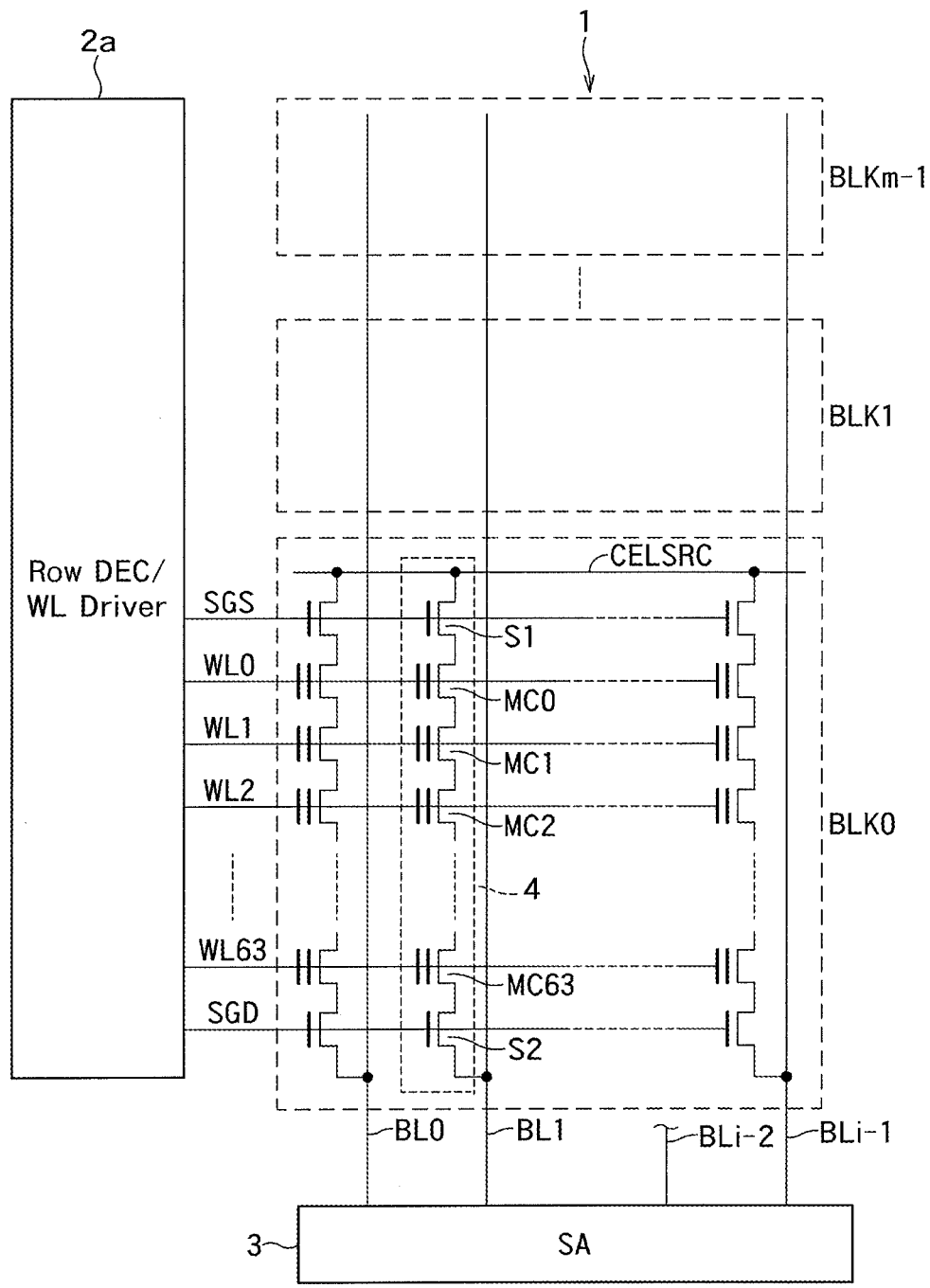
FIG. 2 shows an example of a specific configuration of the memory cell array 1.

FIG. 2 shows an example of a specific configuration of the memory cell array 1. In this example, 64 memory cells MC0 to MC63 series-connected and select gate transistors S1 and S2 connected on both ends of the memory cells MC0 to MC63, respectively, constitute a NAND cell unit (a NAND string) 4. A source of the select gate transistor S1 is connected to a common source line CELSRC and a drain of the select gate transistor S2 is connected to a bit line BL (BL0 to BLi-1). That is, the bit lines BL are connected to one end of current paths of the memory cells MC, respectively. Control gates of the memory cells MC0 to MC63 are connected to word lines WL (WL0 to WL63), respectively, and gates of the select gate transistors S1 and S2 are connected to select gate lines SGS and SGD, respectively.

A range of a plurality of memory cells MC along one word line WL is a page as a unit of batch data read and write. A range of a plurality of NAND cell units 4 arranged in the direction of the word lines WL constitutes a cell block BLK as a unit of batch data erase. In FIG. 2, a plurality of cell blocks BLK0 to BLKm-1 that share the bit lines BL are arrayed in the direction of the bit lines BL to constitute the memory cell array 1. The word lines WL and the select gate lines SGS and SGD are driven by the row decoder 2a. The bit lines BL are connected to a sense amplifier circuit SA of the page buffer 3 respectively. The sense amplifier circuit SA detects data of a memory cell MC selected by the bit line BL and the word line WL.

Figure 3:
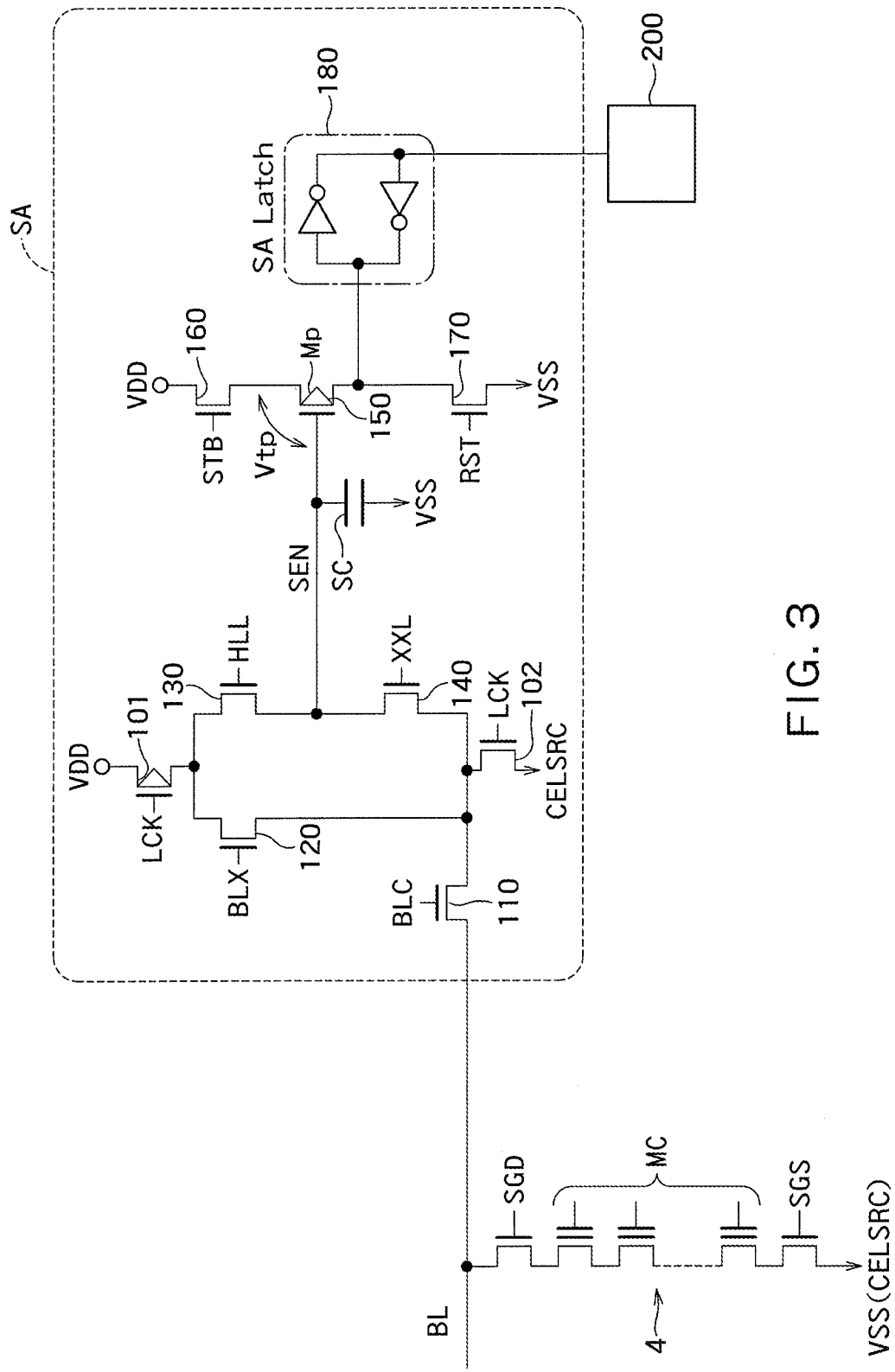
FIG. 3 is a circuit diagram showing an example of a configuration of the sense amplifier circuit SA.

FIG. 3 is a circuit diagram showing an example of a configuration of the sense amplifier circuit SA. The sense amplifier circuit SA is connected between the bit lines BL and a latch part 200 that stores therein detection results of the sense amplifier circuit SA. The sense amplifier circuit SA includes N-transistors 101, 110 to 140, 160, and 170, P-transistors 102 and 150, a sense capacitor SC, and an SA latch circuit 180.

The P-transistor 150 is connected between a power supply voltage VDD and the SA latch circuit 180. A gate of the transistor 150 is connected to a sense node SEN and allows a current corresponding to a voltage of the sense node SEN to flow through. The sense node SEN is connected to a reference voltage VSS (a cell source CELSRC or a ground voltage, for example) via the sense capacitor SC.

The sense node SEN is connected to the power supply voltage VDD via the N-transistor 130 that comes into an ON state at the time of precharging of the sense node SEN. Accordingly, the sense capacitor SC is charged with the power supply voltage VDD at the time of precharging. At the time of data detection, the sense node SEN is also connected to the bit lines BL via the N-transistor 140 and the N-transistor 110. Accordingly, charges from the sense capacitor SC are discharged to memory cells MC via the bit lines BL at the time of data detection. Therefore, the voltage of the sense node SEN changes according to data of the memory cells MC.

A source of the transistor 150 is connected to the power supply voltage VDD via the transistor 160. A drain of the transistor 150 is connected to the SA latch circuit 180 and is also connected to the reference voltage VSS via the transistor 170. The SA latch circuit 180 is further connected to the latch part 200.

A data detection operation of the sense amplifier circuit SA is briefly explained next. In the first embodiment, an access method of either an ABL (All Bit Line) method or a conventional method (a bit line shield method) can be adopted. The ABL method is a method of batch accessing all memory cells that are connected to a word line. The conventional method is a method of accessing (intermittently) alternate memory cells that are connected to a word line. That is, the conventional method is a method of alternately accessing memory cells that are connected to even-numbered bit lines and memory cells that are connected to odd-numbered bit lines.

At the time of precharging, while the transistor 140 is kept OFF, the transistors 110, 120, and 130 are brought to an ON state to charge the sense node SEN. At that time, the bit lines BL are precharged to a desired voltage according to setting of a gate voltage BLC of the transistor 110.

When data of the memory cells MC is to be detected, the transistor 130 is turned OFF to disconnect the power supply voltage VDD from the sense node SEN. According to setting of a gate voltage BLX of the transistor 120, the voltage of the bit lines BL at the time of data detection is kept constant. At the time of data detection, the transistor 140 is turned ON to cause a current according to a conduction state of the memory cells MC to flow from the sense node SEN to the memory cells MC via the bit lines BL. When the memory cells MC are in the conduction state (data "1", for example), the voltage of the sense node SEN decreases and thus the transistor 150 is brought to the ON state. When the memory cells MC are in the non-conduction state (data "0", for example), the voltage of the sense node SEN does not decrease and thus the transistor 150 is kept in the OFF state. At that time, the transistor 110 controls the current flowing to the bit lines BL and the memory cells MC to determine a decrease rate of the voltage of the sense node SEN.

The transistor 160 transmits the voltage of the sense node SEN to the SA latch circuit 180. A strobe signal STB determines a timing when the transistor 160 transmits the voltage of the sense node SEN to the SA latch circuit 180.

Data latched by the SA latch circuit 180 is transferred to the latch part 200. At the time of data transfer, a transfer gate (not shown) is turned ON and the transfer gate transfers the data from the SA latch circuit 180 to the latch part 200. After the latch part 200 stores the data therein, the transistor 170 resets the SA latch circuit 180 based on a reset signal RST.

The P-transistor 101 is connected between the power supply voltage VDD and drains of the transistors 120 and 130. The N-transistor 102 is connected between sources of the transistors 120 and 140 and the reference voltage VSS (the cell source CELSRC or the ground voltage, for example). Gates of the transistors 101 and 102 operate upon reception of a lockout signal LCK. The lockout signal LCK is a signal that becomes logical high at the time of lockout. The lockout is an operation of fixing the voltage of the bit line BL of a column for which data detection has ended at the reference voltage VSS (the cell source CELSRC or the ground voltage) at the time of data detection. Accordingly, no current flows in the bit line BL of a column from which the data has been detected.

When lockout is not performed, the lockout signal LCK is logical low. This brings the transistor 101 to an ON state and the transistor 102 to an OFF state. At that time, a current can be supplied from the power supply voltage VDD to the memory cells MC via the bit lines BL (a no-lockout state).

On the other hand, at the time of lockout, the lockout signal LCK is logical high. Accordingly, the transistor 101 is in an OFF state and the transistor 102 is in an ON state. At that time, no current flows in the bit lines BL (a lockout state). The lockout will be explained later with reference to FIG. 5.

Figure 4:
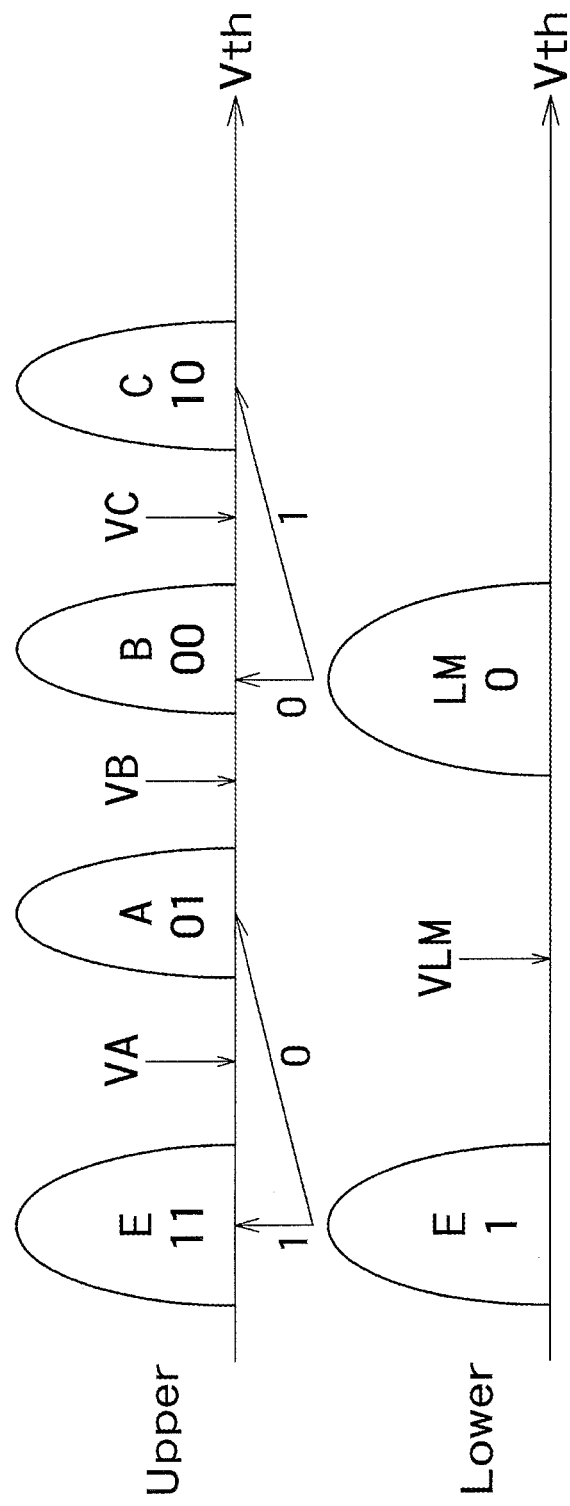
FIG. 4 shows threshold distributions of memory cells MC in a case where write of 2-bit data is performed.

FIG. 4 shows threshold distributions of memory cells MC in a case where write of 2-bit data is performed. In the memory according to the first embodiment, one memory cell MC stores therein 2-bit data. By block erase, threshold voltages Vt of all memory cells MC in a block become a lowest "E (Erase)" level. Thereafter, at the time of write of lower pages, write to raise the threshold voltage to an "LM" level is performed to memory cells MC having lower page data "0". The "E" level and the "LM" level change under an influence of adjacent memory cells to which write is thereafter performed and a threshold distribution width is widened. In the subsequent write of upper pages, the threshold distributions are further moved according to upper page data, so that four narrow threshold distributions "E", "A", "B", and "C" corresponding to data "11", "01", "00", and "10", respectively, are generated. In this case, the lowest erase E level is used as it is as the E level. The second lowest A level is generated by shifting from the E level. The B and C levels are generated by shifting from the LM level.

The NAND flash memory writes data to the memory cells MC by repeating a write loop including a write operation of writing data to selected memory cells and a verify operation of verifying that the data has been written to the selected memory cells plural times. For example, each of write of a lower page (write from data E to data LM) and write of an upper page (write from data E to data A or write from data LM to data B or C) in FIG. 4 is realized by performing a write sequence including the plural write loops.

In the verify operation of each of the write loops, when data E and LM of a lower page is to be detected, it suffices to set the voltage of the relevant word line WL at VLM. This enables the sense amplifier circuit SA to detect data of the lower page.

When data E, A, B, and C of an upper page is to be detected, the voltage of the relevant word line WL is sequentially stepped up to VA, VB, and VC. When the voltage of the word line WL is VA, memory cells MC at the E level are distinguished from memory cells MC at the A to C levels. The memory cells MC at the E level are thus identified. Next, when the voltage of the word line WL is VB, the memory cells MC at the A level are distinguished from the memory cells MC at the B and C levels. Accordingly, the memory cells MC at the A level are identified. Next, when the voltage of the word line WL is VC, the memory cells MC at the B level and the memory cells MC at the C level can be distinguished from each other. Accordingly, the memory cells MC at the B level and the memory cells MC at the C level are identified. By changing the voltage of the word line WL to VA, VB, and VC in this way, the sense amplifier circuit SA can detect the data E, A, B, and C of the upper pages of the memory cells MC.

Figure 5:
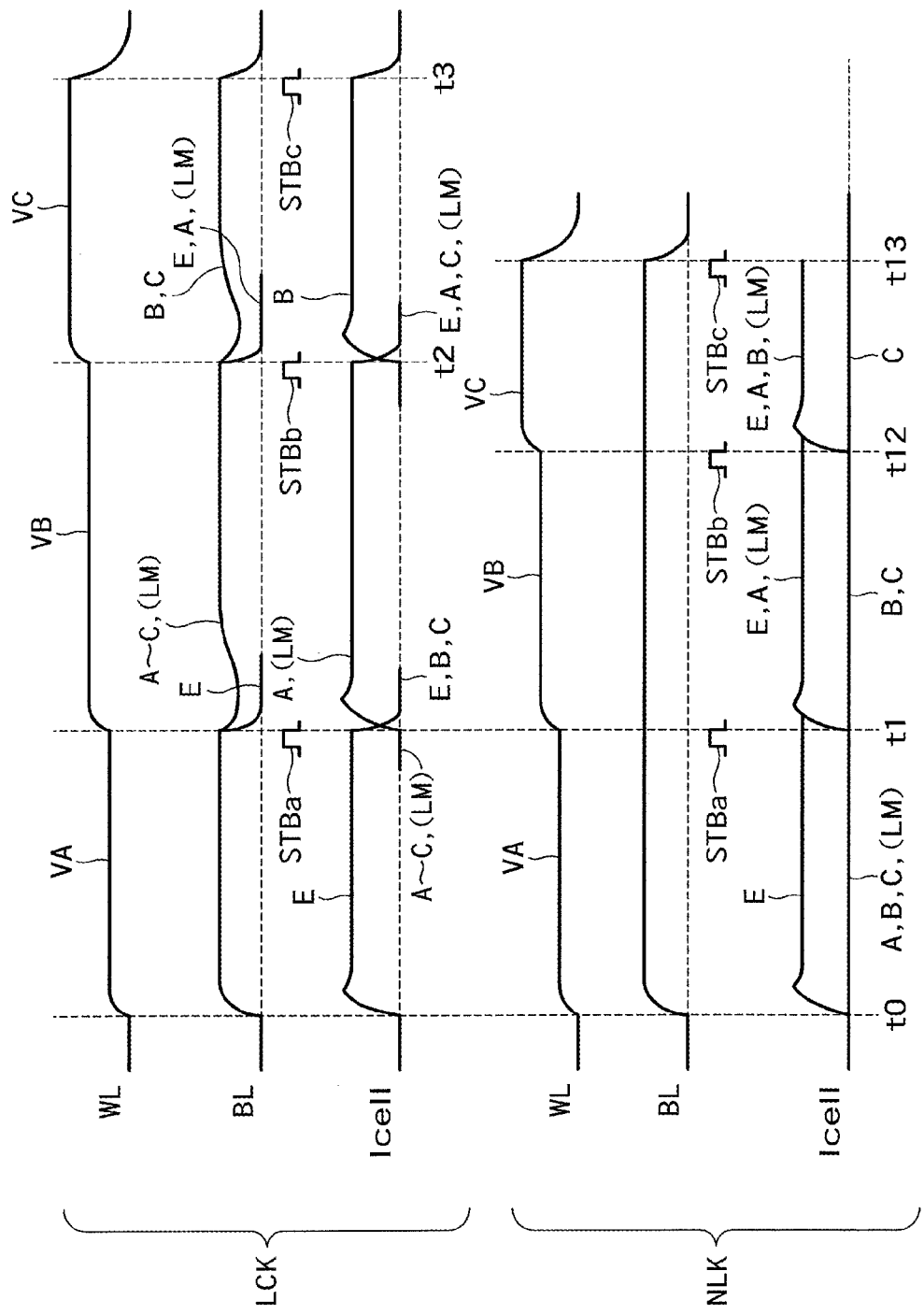
FIG. 5 shows timing charts of operations of a memory in a lockout mode LCK and in a no-lockout mode NLK in a verify operation of a certain write loop, respectively.

FIG. 5 shows timing charts of operations of a memory in a lockout mode LCK (first mode) and in a no-lockout mode NLK (second mode) in a verify operation of a certain write loop, respectively. In FIG. 5, timing charts with respect to an LM level of a lower page are shown as well as timing charts with respect to E to C levels of an upper page.

(Operation in Lockout Mode LCK)

In the lockout mode LCK, the voltage of the word line WL is stepped up to VA, VB, and VC to detect data, as described above.

In a period between times t0 and t1, the voltage of the word line WL is set at VA. At the time t0, data of none of the memory cells MC connected to the word line WL is identified. Therefore, between the times t0 and t1, none of the bit lines BL is locked out. The voltage of the bit lines BL is set to a voltage (a high-level voltage) corresponding to the gate voltage BLX and higher than that of the cell source line CELSRC. In the bit lines BL, currents corresponding to the voltage of the word line WL and data of the memory cells MC flow, respectively. That is, a cell current Icell flows in each of the memory cells MC. A strobe signal STBa is then activated to logical high, which causes the sense amplifier circuit SA to latch data of the memory cells MC. At that time, the memory cells MC at the E level are identified as described above.

After the time t1, the sense amplifier circuit SA then sets the voltage of the bit lines BL connected to the memory cells MC that have been identified to be at the E level to a voltage substantially equal to a source voltage (the ground voltage or the cell source CELSRC, for example) of the memory cells MC. That is, the sense amplifier circuit SA locks out the bit lines BL connected to the memory cells MC at the E level. This causes the voltage of the bit lines BL and the voltage of the cell source CELSRC to be substantially equal and thus almost no current flows in the memory cells MC at the E level after the time t1 in the verify operation of this write loop.

Meanwhile, the memory cells MC at the A to C levels are not identified yet at the time t1. Therefore, in a period between the time t1 and a time t2, the sense amplifier circuit SA maintains the voltage of the bit lines BL connected to the memory cells MC at the A to C levels (or the LM level) at a high-level voltage as described above.

In the period between the times t1 and t2, the voltage of the word line WL is set at VB. At that time, the bit lines BL connected to the memory cells MC at the E level have been locked out. Therefore, the cell current Icell does not flow in the memory cells MC at the E level. Other bit lines BL are not locked out. Therefore, currents corresponding to the voltage of the word line WL and data of the memory cells MC flow in the bit lines BL connected to the memory cells MC at the A to C levels (or the LM level), respectively. That is, the memory cells MC at the A level (or the LM level) come into an ON state and thus the cell current Icell flows in the memory cells MC at the A level (or the LM level). However, the memory cells MC at the B and C levels are kept in an OFF state. Therefore, the cell current Icell does not flow in the memory cells MC at the B and C levels. A strobe signal STBb is then activated to logical high, which causes the sense amplifier circuit SA to latch data of the memory cells MC. At that time, the memory cells MC at the A level are identified as described above.

After the time t2, the sense amplifier circuit SA then sets the voltage of the bit lines BL connected to the memory cells MC at the A level (or the LM level) as well as the memory cells MC at the E level to a voltage substantially equal to the source voltage of the memory cells MC. That is, the sense amplifier circuit SA locks out the bit lines BL connected to the memory cells MC at the E and A levels (or the LM level). Accordingly, almost no current flows in the memory cells MC at the E and A levels (or the LM level) after the time t2 in the verify operation of this write loop.

Meanwhile, the memory cells MC at the B and C levels are not distinguished yet at the time t2. Therefore, in a period between the time t2 and a time t3, the sense amplifier circuit SA maintains the voltage of the bit lines BL connected to the memory cells MC at the B and C levels at the high-level voltage described above.

In the period between the times t2 and t3, the voltage of the word line WL is set at VC. At that time, the bit lines BL connected to the memory cells MC at the E and A levels have been locked out. Therefore, the cell current Icell does not flow in the memory cells MC at the E and A levels. Other bit lines BL are not locked out. Therefore, currents corresponding to the voltage of the word line WL and data of the memory cells MC flow in the bit lines BL connected to the memory cells MC at the B and C levels, respectively. That is, the memory cells MC at the B level come into an ON state and thus the cell current Icell flows in the memory cells MC at the B level. However, the memory cells MC at the C level are kept in an OFF state. Therefore, the cell current Icell does not flow in the memory cells MC at the C level. A strobe signal STBc is then activated to logical high, which causes the sense amplifier circuit SA to latch data of the memory cells MC. At that time, the memory cells MC at the B and C levels are identified as described above. This means that the memory cells MC at the E to C levels (or the LM level) are detected (distinguished) at the time t3. Accordingly, the verify operation in the lockout mode LCK ends. In a case where the lockout mode LCK is set, this verify operation is performed in each of the write loops.

As can be understood with reference to the timing chart of the cell current Icell in the lockout mode LCK shown in FIG. 5, the sense amplifier circuit SA does not cause any current to flow in bit lines BL connected to the memory cells MC from which data has been detected in the lockout mode LCK. Therefore, in the lockout mode LCK, the current consumption in the entire memory is lower than that in the no-lockout mode NLK. The verify operation is performed in each of the write loops included in a write sequence. Therefore, lockout of the bit lines BL connected to the memory cells MC from which data has been detected can greatly reduce the current consumption.

On the other hand, when some bit lines BL are locked out, the voltage of other adjacent bit lines BL that are not locked out temporarily reduces due to the adjacent interference effect. A certain time is required for the voltage that has thus temporarily reduced to return to the original level. That is, it takes a time for the voltage of the bit lines BL adjacent to the locked-out bit lines BL to recover. For example, immediately after the time t1 in FIG. 5, the voltage of the bit lines BL corresponding to the A to C levels (or the LM level) temporarily reduces due to capacitive coupling with the locked-out bit lines BL corresponding to the E level. The voltage of the bit lines BL corresponding to the A to C levels returns to the original level after a certain time. Similarly, immediately after the time t2 in FIG. 5, the voltage of the bit lines BL corresponding to the B and C levels temporarily reduces due to capacitive coupling with the locked-out bit lines BL corresponding to the E and A levels. The voltage of the bit lines BL corresponding to the B and C levels returns to the original level after a certain time.

In this way, while the verify time is relatively long in the lockout mode LCK, the cell current Icell is prevented from flowing in the memory cells MC from which data has been detected. Therefore, the lockout mode LCK has a characteristic that the current consumption (Icc) of the entire memory is relatively small.

(Operation in No-Lockout Mode NLK)

Also in the no-lockout mode NLK, the voltage of the word line WL is stepped up to VA, VB, and VC as described above.

The operation of the memory between times t0 and t1 can be identical to that between the times t0 and t1 in the lockout mode LCK. Between the times t0 and t1, the memory cells MC at the E level are identified. However, in the no-lockout mode NLK, the sense amplifier circuit SA does not lock out the voltage of the bit lines BL connected to the memory cells MC that are identified as the E level. Therefore, after the time t1, the sense amplifier circuit SA maintains the voltage of the bit lines BL at the high-level voltage described above regardless of whether the data detection result is known.

In a period between the time t1 and a time t12, the voltage of the word line WL is set at VB. Currents corresponding to the voltage of the word line WL and the data of the memory cells MC flow in the bit lines BL, respectively. At that time, the cell current Icell flows not only in the memory cells MC at the A level (or the LM level) but also in the memory cells MC at the E level. Because the memory cells MC at the B and C levels are kept in an OFF state, the cell current Icell does not flow in the memory cells MC at the B and C levels. The strobe signal STBb is then activated to logical high, which causes the sense amplifier circuit SA to latch data of the memory cells MC. At that time, the memory cells MC at the A level are identified.

In a period between the time t12 and a time t13, the voltage of the word line WL is set at VC. Currents corresponding to the voltage of the word line WL and data of the memory cells MC flow in the bit lines BL, respectively. The cell current Icell flows not only in the memory cells MC at the B level but also in the memory cells MC at the E and A levels (or the LM level). Because the memory cells MC at the C level are kept in an OFF state, the cell current Icell does not flow in the memory cells MC at the C level. The strobe signal STBc is then activated to logical high, which causes the sense amplifier circuit SA to latch the data of the memory cells MC. At that time, the memory cells MC at the B and C levels are identified. This means that the memory cells MC at the E to C levels (and the LM level) are detected (distinguished) at the time t13. Accordingly, the verify operation in the no-lockout mode NLK ends. In a case where the no-lockout mode NLK is set, this verify operation is performed in each of the write loops.

As can be understood with reference to the cell current Icell in the no-lockout mode NLK shown in FIG. 5, the sense amplifier circuit SA causes a current to flow in the respective bit lines BL regardless of whether data has been detected in the no-lockout mode NLK. Therefore, the current consumption (Icc) of the entire memory is higher than that in the lockout mode LCK.

On the other hand, in the no-lockout mode NLK, the voltage of the bit lines BL is kept at a high-level voltage during the verify operation as shown in FIG. 5. Therefore, the bit lines BL are not affected by the adjacent interference effect and thus there is no need to wait for recovery of the voltage of the bit lines BL. For example, the period between the times t1 and t12 in the no-lockout mode NLK is shorter than the period between the times t1 and t2 in the lockout mode LCK. The period between the times t12 and t13 in the no-lockout mode NLK is also shorter than the period between the times t2 and t3 in the lockout mode LCK.

In this way, the no-lockout mode NLK has a characteristic that the verify time is relatively short while the current consumption Icc of the memory is relatively high.

The current consumption Icc of a memory in a write sequence is explained next with reference to FIGS. 6A to 6E.

FIGS. 6A to 6E show threshold distributions of memory cells MC at respective stages in a write sequence. In FIGS. 6A to 6E, write from the E level to the A level is shown for convenience sake. A verify level is VA. Because write from the LM level to the B or C level can be easily inferred with reference to FIGS. 6A to 6E, explanations thereof are omitted.

Figure 6:
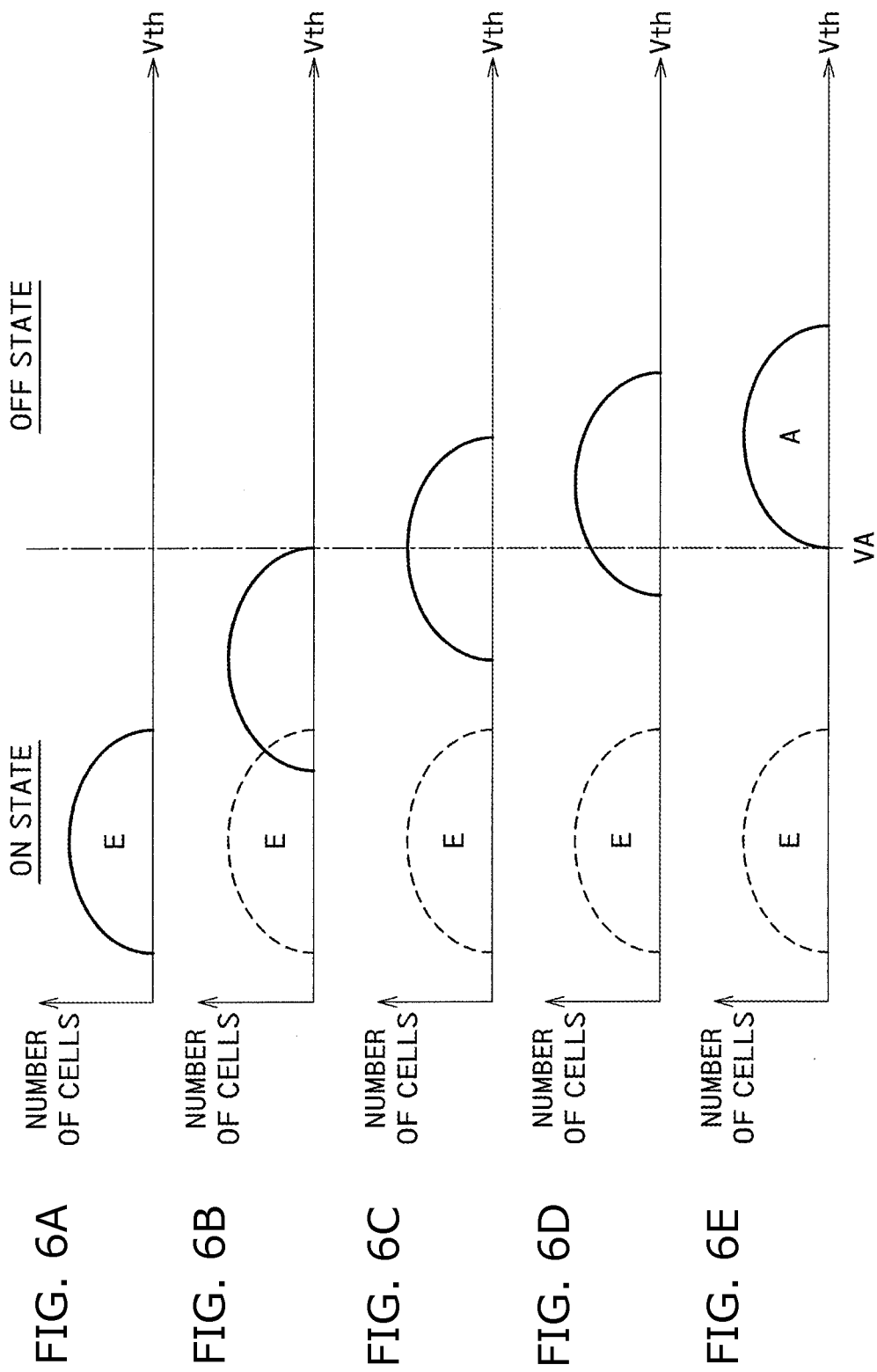
FIG. 6A shows a threshold distribution of memory cells MC at a stage in a write sequence.
FIG. 6B shows a threshold distribution of memory cells MC at a stage in a write sequence.
FIG. 6C shows a threshold distribution of memory cells MC at a stage in a write sequence.
FIG. 6D shows a threshold distribution of memory cells MC at a stage in a write sequence.
FIG. 6E shows a threshold distribution of memory cells MC at a stage in a write sequence.

First, it is assumed that a plurality of memory cells MC are at the E level at an initial time of the write sequence as shown in FIG. 6A. At that time, all the memory cells MC come into an ON state in the verify operation to allow the cell current Icell from the sense amplifier circuit SA to flow.

Thereafter, by repeatedly performing the write loops, the threshold distribution of the memory cells MC transitions gradually to the A level as shown in FIGS. 6B to 6D. In FIG. 6C, about half of the memory cells MC exceed the verify level VA. That is, about half of the memory cells MC come into an OFF state in the verify operation. In FIG. 6D, most of the memory cells MC exceed the verify level VA. That is, most of the memory cells MC come into an OFF state in the verify operation.

When all the memory cells MC exceed the verify level VA in FIG. 6E, all the memory cells MC come into an OFF state in the verify operation.

In this way, because all the memory cells MC are at the E level (an erase state) at the initial time of a write sequence, the sum of the cell currents Icell in the verify operation is quite large. When the write loops in the write sequence are repeated and the threshold distributions of some of the memory cells MC become high, the sum of the cell currents Icell in the verify operation gradually decreases. When all the memory cells MC exceed the verify level VA, the sum of the cell currents Icell in the verify operation becomes quite small. That is, although the sum of the cell currents Icell is quite large at a start stage of the write sequence, the sum of the cell currents Icell is small at a termination stage of the write sequence.

The memory according to the first embodiment thus switches the mode between the lockout mode LCK and the no-lockout mode NLK in the middle of the write sequence.

For example, because the current consumption is large at a start stage of a write sequence, the sense amplifier circuit SA operates in the lockout mode LCK. That is, in the verify operation of each of the write loops, the sense amplifier circuit SA locks out bit lines BL connected to memory cells MC having data (threshold levels) identified. This can suppress the current consumption at the initial time of the write sequence.

On the other hand, because the current consumption is small at the termination stage of the write sequence, the sense amplifier circuit SA operates in the no-lockout mode NLK. That is, in the verify operation of each of the write loops, the sense amplifier circuit SA does not lock out the bit lines BL connected to the memory cells MC regardless of whether data (the threshold levels) is identified. This can shorten the time of the write loop.

In this way, priority is assigned to reduction of the current consumption over shortening of the verify time at the start stage of a write sequence in which the current consumption is large. On the other hand, at a termination stage of the write sequence in which the current consumption is small, priority is assigned to shortening of the verify time over reduction of the current consumption. The first embodiment can thus achieve both suppression of the current consumption and shortening of the write sequence time.

For example, at a start stage of a write sequence, the sense amplifier circuit SA operates in the lockout mode LCK. At that time, the cell current Icell is caused to flow in the bit lines BL that are not locked out (data undetected) without being caused to flow in the bit lines BL that are locked out (data detected) as shown in FIG. 5. Therefore, the current consumption Icc of the memory is suppressed. Meanwhile, at a termination stage of the write sequence, the sense amplifier circuit SA operates in the no-lockout mode NLK. Therefore, the verify time is shortened. As explained with reference to FIGS. 6A to 6E, many of the memory cells MC have exceeded the verify level at that time. Accordingly, even in the no-lockout mode NLK, the cell current Icell is not so high as will be explained later. The first embodiment can thus achieve both suppression of the current consumption and shortening of the write sequence time.

Switching from the lockout mode LCK to the no-lockout mode NLK can be performed, for example, based on the number of write loops. The number of write loops is generally counted by the sequence control circuit 7. Therefore, when the number of write loops reaches a predetermined value in a certain write sequence, the sense amplifier circuit SA receives a command from the sequence control circuit 7 and switches the mode from the lockout mode LCK to the no-lockout mode NLK. It suffices that the sense amplifier circuit SA performs the verify operation in the no-lockout mode NLK in the subsequent write loops. The number of write loops can be arbitrarily changed.

Figure 7:
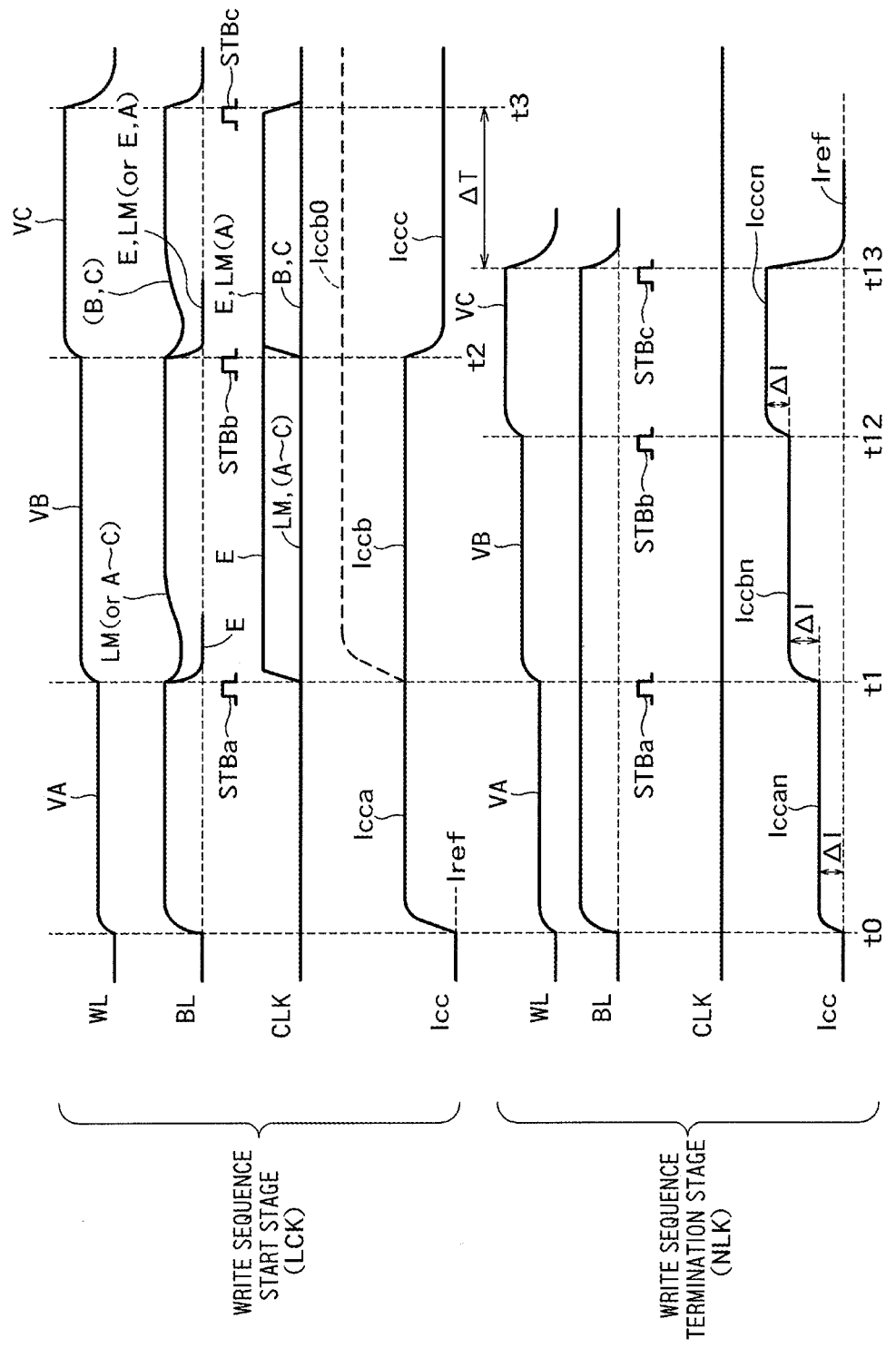
FIG. 7 shows timing charts of a relation between mode switching and the current consumption Icc of the entire memory according to the first embodiment.

FIG. 7 shows timing charts of a relation between mode switching and the current consumption Icc of the entire memory according to the first embodiment. The current consumption Icc is the current consumption of the entire memory including the cell currents Icell. The voltage of the word line WL, the voltage of the bit lines BL, and the strobe signals STBa to STBc are as explained with reference to FIG. 5.

(Start Stage of Write Sequence: Lockout Mode)

According to the first embodiment, the sense amplifier circuit SA operates in the lockout mode LCK at the initial time of a write sequence. Therefore, at that time, the signal LCK shown in FIG. 3 is logical low. Many of the memory cells MC are still at the E level or the LM level at that stage. Accordingly, when the verify level (the voltage of the word line WL) is VA, the memory cells MC at the E level come into an ON state and the memory cells MC at the LM level are in an OFF state. At that time, the current consumption Icc steps up from a reference current value Iref to Icca. The reference current value Iref is the current consumption different from the cell current Icell.

After a time t1, the sense amplifier circuit SA locks out the bit lines BL connected to the memory cells MC at the E level. That is, the signal LCK for columns corresponding to the E level becomes logical high. The signal LCK for other columns corresponding to the LM level remains logical low. Accordingly, when the verify level is VB between the time t1 and a time t2, the memory cells MC at the LM level come into an ON state and the memory cells MC at the E level are in an OFF state. At that time, the current consumption is Iccb.

Generally, threshold levels are assigned substantially evenly to the memory cells MC by data randomization. Therefore, in lower pages, the number of memory cells MC at the E level and the number of memory cells MC at the LM level are substantially equal. That is, it can be considered that the number of the memory cells MC at the E level and the number of the memory cells MC at the LM level are substantially equal at the initial time of the write sequence. Accordingly, the current consumption Iccb is substantially equal to Icca. Similarly, in upper pages, the number of the memory cells MC at the E to C levels is assigned substantially evenly by data randomization.

When the verify level is VC between the time t2 and a time t3, substantially all the memory cells MC at the E level and the LM level are in an OFF state. At that time, the current consumption is Iccc. Write of upper pages has not progressed yet at the initial time of the write sequence. Therefore, the current consumption Iccc is quite smaller than Icca and Iccb and is substantially equal to the reference current value Iref.

Accordingly, the current consumption Icc of the memory is stepped up from the reference current value Iref to Icca (Iccb) and then returns to the reference current value Iref without being stepped up. However, there is a case that some memory cells MC exceed the B level. In this case, Iccc is slightly higher than the reference current value Iref.

As the write loops are thereafter repeated and the write sequence progresses, pieces of data are gradually written. Therefore, the number of memory cells MC that transition from the E level to the A level increases. Accordingly, the current consumption Icca reduces as the write sequence progresses.

On the other hand, the number of memory cells MC that transition from the LM level to the B level or the C level increases when the write sequence progresses. Therefore, the current consumption Iccc increases as the write sequence progresses. However, because the sense amplifier circuit SA operates in the lockout mode LCK, the current consumption Iccc increases by cell currents flowing in the memory cells MC at the C level.

Meanwhile, depending on the verify level VB, the number of memory cells MC to which data is written to exceed the verify level VB is small in write of upper pages as shown in FIG. 4. Therefore, even when the write sequence progresses, the current consumption Iccb does not change so much.

(Termination Stage of Write Sequence: No-Lockout Mode)

When the write sequence progresses, threshold distributions of many memory cells MC become the E to C levels. Therefore, when the sense amplifier circuit SA is switched to the no-lockout mode NLK, the memory cells MC at the E level come into an ON state between times t0 and t1. The current consumption of the memory at this time is assumed to be Iccan. Between the time t1 and a time t12, the memory cells MC at the E and A levels come into an ON state. The current consumption of the memory at this time is assumed to be Iccbn. Between the time t12 and a time t13, the memory cells MC at the E, A, and B levels come into an ON state. The current consumption of the memory at this time is assumed to be Icccn.

Assuming that about a quarter of the respective memory cells MC is assigned to the E to C levels respectively by data randomization as described above, the current consumption increases to Iccan, Iccbn, and Icccn in this order by substantially-equal increments ΔI, respectively, as shown in FIG. 7. That is, the current consumption Icc of the memory is stepped up from the reference current value Iref to Iccan, is then stepped up to Iccbn (>Iccan), is thereafter further stepped up to Icccn (>Iccbn), and then returns to the reference current value Iref.

If the sense amplifier circuit SA operates in the no-lockout mode NLK at a start stage of a write sequence, not only the memory cells MC at the LM level but also all the memory cells MC at the E level come into an ON state between the times t1 and t3. Therefore, as indicated by a dashed line in FIG. 7, the current consumption becomes quite large as Iccb0. For example, between the times t0 and t1, the memory cells MC at the E level come into an ON state and the memory cells MC at the LM level come into an OFF state, so that the current consumption Icc becomes half of Iccb0. Between the times t1 and t3, the memory cells MC at both the E and LM levels come into an ON state and thus the current consumption Icc becomes Iccb0.

In contrast, according to the first embodiment, because the sense amplifier circuit SA operates in the lockout mode LCK at a start stage of a write sequence, the current consumption (Icca, Iccb, and Iccc) of the memory is suppressed to be quite low. For example, between the times t0 and t1, because the memory cells MC at the E level come into an ON state and the memory cells MC at the LM level come into an OFF state, the current consumption Icc becomes half of Iccb0. Between the times t1 and t2, because the memory cells MC at the LM level come into an ON state and the memory cells MC at the E level are locked out, the current consumption Icc becomes half of Iccb0. Because the memory cells MC at both the E and LM levels are locked out between the times t2 and t3, the current consumption Icc becomes 0. In this case, Iref=0.

If the sense amplifier circuit SA operates in the lockout mode LCK at a termination stage of a write sequence, the period of the verify operation needs to be longer to recover the bit lines BL.

In contrast, according to the first embodiment, the sense amplifier circuit SA is switched to the no-lockout mode NLK at a termination stage of a write sequence. The no-lockout mode NLK is shorter than the lockout mode LCK by a time ΔT. Therefore, the first embodiment can shorten the time of the write sequence. Because about a quarter of the respective memory cells MC is assigned to the E to C levels respectively, the current consumption Icccn is considered to be about three-quarters of Iccb0.

As described above, the first embodiment can achieve both suppression of the current consumption and shortening of the write sequence time.

Second Embodiment

Figure 8:
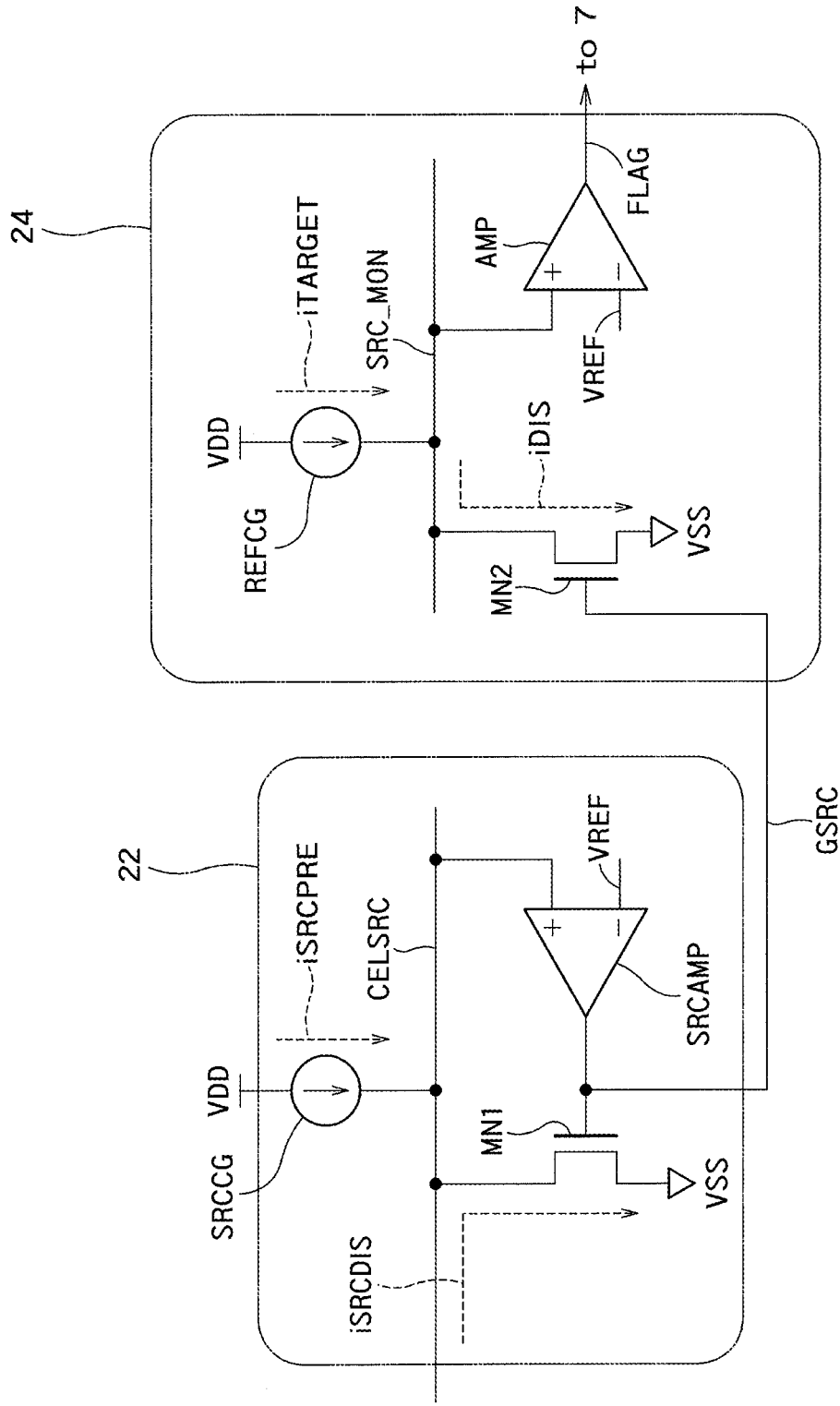
FIG. 8 shows an example of configurations of a source-voltage adjustment circuit 22 and a cell-current detection circuit 24 in a memory according to a second embodiment.

FIG. 8 shows an example of configurations of a source-voltage adjustment circuit 22 and a cell-current detection circuit 24 in a memory according to a second embodiment. In the second embodiment, the sense amplifier circuit SA switches the mode between the lockout mode LCK and the no-lockout mode NLK according to a value of a current (that is, the cell current Icell) flowing in the relevant bit line BL. For example, at a start stage of a write sequence, the sense amplifier circuit SA performs a verify operation in the lockout mode LCK. When the cell current Icell then falls below a predetermined value, the sense amplifier circuit SA performs a verify operation in the no-lockout mode NLK. Other configurations and operations of the second embodiment can be identical to corresponding configurations and operations of the first embodiment. The predetermined value of the cell current Icell can be changed arbitrary.

The source-voltage adjustment circuit 22 and the cell-current detection circuit 24 used to measure the cell current Icell are explained below.

The source-voltage adjustment circuit 22 is a circuit that maintains the voltage of the source line CELSRC at a predetermined voltage. The source-voltage adjustment circuits 22 as many as the source lines CELSRC are provided and, for example, one source-voltage adjustment circuit 22 is provided for one block. The source-voltage adjustment circuit 22 includes a constant current source SRCCG, an NMOS transistor MN1, and an operational amplifier SRCAMP.

The constant current source SRCCG has a function of supplying a keeper current iSRCPRE to the relevant source line CELSRC. The constant current source SRCCG is connected between the power supply voltage VDD and the source line CELSRC. A drain of the N-transistor MN1 is connected to the source line CELSRC and a source thereof is connected to the reference voltage VSS. Two inputs of the operational amplifier SRCAMP are connected to the source line CELSRC and a reference voltage VREF, respectively. An output of the operational amplifier SRCAMP is connected to a gate of the N-transistor NM1.

The cell-current detection circuit 24 is a circuit that compares the size of the cell current Icell with the size of a reference current iTARGET. The cell-current detection circuits 24 as many as the source lines CELSRC are provided and, for example, one cell-current detection circuit 24 is provided for one block. The cell-current detection circuit 24 includes a pseudo source line SRC_MON, a reference current source REFCG, an N-transistor MN2, and an operational amplifier AMP. The reference current source REFCG, the N-transistor MN2, and the operational amplifier AMP are connected independently to the pseudo source line SRC_MON and the pseudo source line SRC_MON is electrically isolated from parts other than these parts.

The reference current source REFCG is a circuit that is connected between the power supply voltage VDD and the pseudo source line SRC_MON and that supplies the reference current iTARGET to the pseudo source line SRC_MON. A drain of the N-transistor MN2 is connected to the pseudo source line SRC_MON and a source thereof is connected to VSS (a ground voltage GND). A voltage equal to that of a gate electrode of the transistor MN1 is applied to a gate of the N-transistor MN2. The transistor MN2 thus controls a current flowing from the pseudo source line SRC_MON to the reference voltage VSS. The transistor MN2 has the same conductivity and characteristics as those of the transistor MN1. Two inputs of the operational amplifier AMP are connected to the pseudo source line SRC_MON and the reference voltage VREF, respectively, and a comparison result between the voltage of the pseudo source line SRC_MON and the reference voltage VREF is output therefrom as an output signal FLAG. The output signal FLAG is, for example, a binary digital signal and is output to the sequence control circuit 7.

An operation of detecting the cell current Icell is briefly explained next.

The voltage of the source line CELSRC is kept substantially constant by the transistor MN1 and the operational amplifier SRCAMP. This causes the cell current Icell to be substantially equal to a discharge current iSRCDIS. The characteristics of the transistors MN1 and MN2 are equal and the gates thereof are common. Therefore, the discharge current iSRCDIS is equal to a discharge current iDIS. That is, the cell current Icell, the discharge current iSRCDIS, and the discharge current iDIS are equal. Accordingly, if the cell current Icell is larger than the reference current iTARGET, the discharge current iDIS becomes larger than the reference current iTARGET and thus the voltage of the pseudo source line SRC_MON is reduced to be lower than the reference voltage VREF. As a result, the value of the output signal FLAG from the operational amplifier AMP becomes "L". On the other hand, if the cell current Icell is smaller than the reference current iTARGET, the discharge current iDIS becomes smaller than the reference current iTARGET and thus the voltage of the pseudo source line SRC_MON is increased to be higher than the reference voltage VREF. As a result, the value of the output signal FLAG from the operational amplifier AMP becomes "H". In this way, the size of the cell current Icell with reference to the size of the reference current iTARGET can be determined according to the value of the output signal FLAG.

Figure 9:
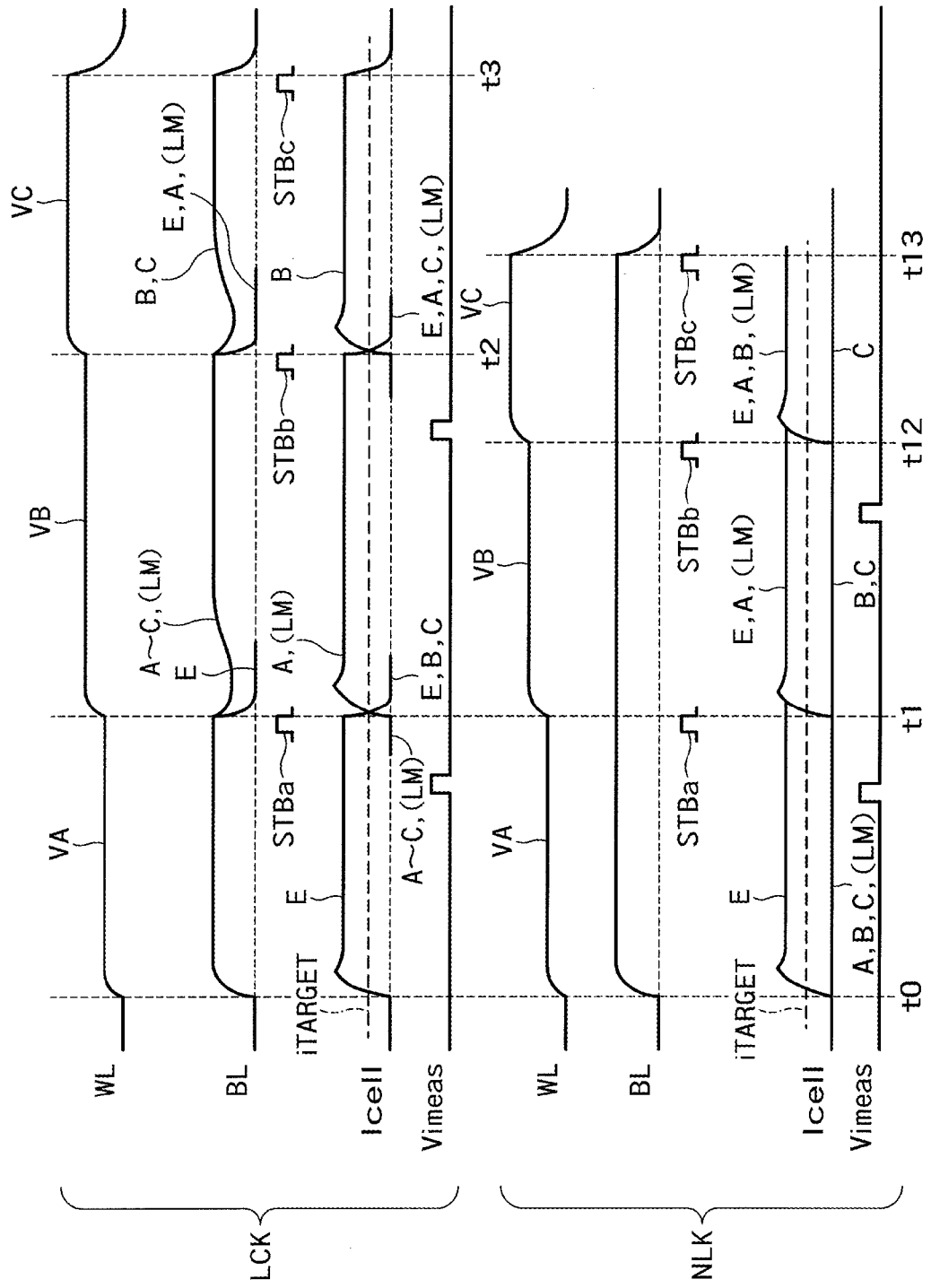
FIG. 9 shows timing charts of respective memory operations in the lockout mode LCK and the no-lockout mode NLK according to the second embodiment.

FIG. 9 shows timing charts of respective memory operations in the lockout mode LCK and the no-lockout mode NLK according to the second embodiment. In FIG. 9, operations of the word lines WL, the bit lines BL, and the cell current Icell can be identical to those in FIG. 5.

In the second embodiment, to measure the cell current Icell, a current measurement signal Vimeas is input as a pulse signal before the strobe signals STBa and STBb. The sequence control circuit 7 drives the source-voltage adjustment circuit 22 and the cell-current detection circuit 24 shown in FIG. 8 in response to input of the current measurement signal Vimeas. This enables the sequence control circuit 7 to acquire the cell currents Icell corresponding to the bit lines BL, respectively.

Therefore, in the second embodiment, when the cell current Icell is larger than the reference current iTARGET as a predetermined value at a start stage of a write sequence, the sense amplifier circuit SA operates in the lockout mode LCK. When the write sequence progresses and the cell current Icell falls below the reference current iTARGET, the sense amplifier circuit SA is switched from the lockout mode LCK to the no-lockout mode NLK. Switching between the lockout mode LCK and the no-lockout mode NLK can be performed in this way according to the cell current Icell. The second embodiment can also achieve effects identical to those of the first embodiment.

(Modification)

The sense amplifier circuit SA can be switched from the lockout mode LCK to the no-lockout mode NLK according to the number of memory cells MC to which data write has not been ended yet or the number of memory cells MC to which data write has been ended. The number of memory cells MC to which data write has not been ended can be detected by bit scanning. The bit scanning is an operation of detecting the number of bits that have passed verification or the number of bits that have not passed verification in write data latched by the page buffer PB. In the page buffer PB, the bits that have passed verification are changed to the E level. Therefore, the sequence control circuit 7 can detect the number of bits that have passed verification or the number of bits that have not passed verification by counting bits at the E level or bits at levels other than the E level in the page buffer PB, respectively. At that time, the bits at the E to C levels may be counted individually. It suffices that the sequence control circuit 7 switches the sense amplifier circuit SA from the lockout mode LCK to the no-lockout mode NLK when the number of bits that have passed verification reaches a predetermined value (when the number of bits that have not passed verification falls below the predetermined value).

The first and second embodiments and the modification described above can be combined. That is, the sense amplifier circuit SA can be switched from the lockout mode LCK to the no-lockout mode NLK when the number of write loops reaches a predetermined value, when the cell current Icell falls below a predetermined value, or when the number of the memory cells to which data has been written reaches a predetermined value.

The configuration of the memory cell array 1 is described, for example, in U.S. patent application Ser. No. 12/407,403 filed on Mar. 19, 2009 and named "Three-dimensional stacked nonvolatile semiconductor memory". The configuration is also described in U.S. patent application Ser. No. 12/406,524 filed on Mar. 18, 2009 and named "Three-dimensional stacked nonvolatile semiconductor memory", U.S. patent application Ser. No. 12/679,991 filed on Mar. 25, 2010 and named "Nonvolatile semiconductor storage device and manufacturing method thereof", and U.S. patent application Ser. No. 12/532,030 filed on Mar. 23, 2009 and named "Semiconductor memory and manufacturing method thereof". The above patent applications are incorporated by reference herein in their entirety.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a memory cell array comprising a plurality of memory cells;
a plurality of word lines connected to the memory cells;
a plurality of bit lines connected to one end of current paths of the memory cells; and
a sense amplifier part connected to the bit lines, wherein
a data write operation comprises a first write loop and a second write loop,
the first write loop comprises a first program operation and a first verify operation,
the second write loop comprises a second program operation and a second verify operation,
the sense amplifier part discharges a voltage of at least one of the bit lines in the first verify operation, and
the sense amplifier part keeps voltages of the bit lines in the second verify operation.

2. The device of claim 1, wherein
the sense amplifier part has a first mode in which voltages of ones of the bit lines connected to memory cells having data detection results known are set to a first voltage in the first verify operation, and a second mode in which voltages of the bit lines are set to a second voltage in the second verify operation regardless of whether data detection results are known, the first voltage is substantially equal to a source voltage of the memory cells, the second voltage is higher than the source voltage of the memory cells,
the sense amplifier part performs respective verify operations of the write loops in the first mode at an initial time of the write sequence, and
the sense amplifier part performs respective verify operations of the write loops in the second mode when number of write loops reaches a first value.

3. The device of claim 1, wherein
the sense amplifier part has a first mode in which voltages of ones of the bit lines connected to memory cells having data detection results known are set to a first voltage in the first verify operation, and a second mode in which voltages of the bit lines are set to a second voltage in the second verify operation regardless of whether data detection results are known, the first voltage is substantially equal to a source voltage of the memory cells, the second voltage is higher than the source voltage of the memory cells,
the sense amplifier part performs respective verify operations of the write loops in the first mode when a current value flowing in the memory cells is above a predetermined value, and
the sense amplifier part performs respective verify operations of the write loops in the second mode when a current value flowing in the memory cells falls below a predetermined value.

4. The device of claim 3, wherein
data write is performed in a write sequence in which the write loops are repeated plural times,
the sense amplifier part performs respective verify operations of the write loops in the first mode at an initial time of the write sequence, and
the sense amplifier part performs respective verify operations of the write loops in the second mode when a current value flowing in the memory cells falls below a predetermined value.

5. The device of claim 1, wherein
the sense amplifier part has a first mode in which voltages of ones of the bit lines connected to memory cells having data detection results known are set to a first voltage in the first verify operation, and a second mode in which voltages of the bit lines are set to a second voltage in the second verify operation regardless of whether data detection results are known, the first voltage is substantially equal to a source voltage of the memory cells, the second voltage is higher than the source voltage of the memory cells,
the sense amplifier part performs respective verify operations of the write loops in the first mode at an initial time of the write sequence, and
the sense amplifier part performs respective verify operations of the write loops in the second mode when number of ones of the memory cells to which data has been written reaches a predetermined value.

6. The device of claim 4, wherein
the sense amplifier part performs respective verify operations of the write loops in the first mode at an initial time of the write sequence, and
the sense amplifier part performs respective verify operations of the write loops in the second mode when number of the write loops reaches a first value, when a current value flowing in the bit lines falls below a predetermined value, or when number of ones of the memory cells to which data has been written reaches a predetermined value.

7. The device of claim 2, wherein the sense amplifier part performs setting to the first voltage or the second voltage with respect to each of the bit lines in the verify operation in the first mode.

8. A semiconductor storage device comprising:
a memory cell array comprising a plurality of memory cells;
a plurality of word lines connected to the memory cells;
a plurality of bit lines connected to one end of current paths of the memory cells; and
a sense amplifier part connected to the bit lines, wherein
data write is performed in a write sequence in which a write loop is repeated plural times, the write loop including a write operation of writing data to the memory cells and a verify operation of verifying that data has been written to the memory cells, and
current consumption in the verify operation has a first mode in which the current consumption steps up from a reference current value to a first current value and then returns to the reference current value, and a second mode in which the current consumption steps up from a reference current value to a first current value, steps up to a second current value larger than the first current value, further steps up to a third current value larger than the second current value, and then returns to the reference current value.

9. The device of claim 8, wherein respective verify operations of the write loops are performed in the first mode at an initial time of the write sequence, and respective verify operations of the write loops are performed in the second mode when number of the write loops reaches a predetermined value.

10. The device of claim 8, wherein respective verify operations of the write loops are performed in the first mode when a current value flowing in the memory cells is above a predetermined value, and respective verify operations of the write loops are performed in the second mode when a current value flowing in the memory cells falls below a predetermined value.

11. The device of claim 8, wherein respective verify operations of the write loops are performed in the first mode at an initial time of the write sequence, and respective verify operations of the write loops are performed in the second mode when a current value flowing in the memory cells falls below a predetermined value.

12. The device of claim 8, wherein respective verify operations of the write loops are performed in the first mode at an initial time of the write sequence, and respective verify operations of the write loops are performed in the second mode when number of the write loops reaches a predetermined value or when a current value flowing in the bit lines falls below a predetermined value.

* * * * *